US008839511B2

(12) United States Patent
Krupa

(10) Patent No.: US 8,839,511 B2

(45) Date of Patent: Sep. 23, 2014

(54) METHOD OF PROVIDING A REMOVABLE OVERHEAD LIGHT

(76) Inventor: William John Krupa, San Antonio, TX (US)

( * ) Notice: Subject to any disclaimer, the term of this patent is extended or adjusted under 35 U.S.C. 154(b) by 388 days.

(21) Appl. No.: 13/091,284

(22) Filed: Apr. 21, 2011

(65) Prior Publication Data

US 2012/0266449 A1 Oct. 25, 2012

(51) Int. Cl.

| | |
|---|---|
| ***H01R 43/00*** | (2006.01) |
| ***H05K 13/00*** | (2006.01) |
| ***F21V 19/00*** | (2006.01) |
| ***F21S 8/04*** | (2006.01) |
| *F21V 21/03* | (2006.01) |
| *F21V 3/02* | (2006.01) |

(52) U.S. Cl.

CPC ................ *F21S 8/043* (2013.01); *F21V 21/03* (2013.01); *F21V 19/00* (2013.01); *F21V 3/02* (2013.01)

USPC .............................................. 29/854; 29/855

(58) Field of Classification Search

USPC .......... 29/854, 592.1, 855; 439/313, 537, 892

See application file for complete search history.

(56) References Cited

U.S. PATENT DOCUMENTS

| | | | | |
|---|---|---|---|---|
| 6,325,654 | B1 * | 12/2001 | Kerr et al. | 439/313 |
| 6,464,524 | B1 | 10/2002 | Kerr, Jr. et al. | |
| 6,616,112 | B1 * | 9/2003 | Tseng | 248/342 |
| 6,634,901 | B2 | 10/2003 | Kerr, Jr. | |
| 6,799,982 | B2 | 10/2004 | Kerr, Jr. | |
| 6,997,740 | B2 | 2/2006 | Kerr | |
| 7,064,269 | B2 | 6/2006 | Smith | |

* cited by examiner

*Primary Examiner* — Thiem Phan

(57) ABSTRACT

A plug-in overhead light is shown with an overhead female type, twist lock, electrical plug. The plug-in overhead light has a male type, twist lock, electrical plug. Upon plugging in the overhead light and twisting to lock, additional structural support for the overhead light is provided. Other than just the twist lock, electrical plug, the junction box is anchored to a ceiling joist and supports the overhead light projecting there below. A decorative cover extends over the junction box and may be used to hold the light globe in position. The male type, twist lock, electrical plug has a bulb socket on the end opposite the electrical plug.

1 Claim, 2 Drawing Sheets

METHOD OF PROVIDING A REMOVABLE OVERHEAD LIGHT

BACKGROUND OF THE INVENTION

1. Technical Field

The present invention relates to overhead lights and, more particularly, a plug-in connection for an overhead light so that the overhead light is not hard-wired into place.

2. Description of the Prior Art

In the typical building or home, there are numerous electrical plugs along the walls where various appliances may be plugged in and subsequently unplugged. The electrical plugs are hard-wired into the electrical system for the building. The electrical plug is maintained inside of an electrical junction box that is securely attached to the structure of the building. The appliance that is plugged into the electrical plug may be unplugged at any time from on electrical plug and moved to another electrical plug inside of the building. Also, appliances may change.

Concerning light for the home, floor lamps and table lamps are plugged into electrical plugs. The floor lamps/table lamps may be unplugged, moved, plugged in again or repaired while unplugged. It is not uncommon that lamps plugged into electrical outlets may change as time passes and styles change.

On the other hand, lights that are located in the ceiling of a building are normally hard-wired into position. An electrician will normally run an electrical connection from a wall switch to an overhead junction box where the overhead light is to be mounted. The overhead junction box is normally secured in place to a cross-brace between ceiling joists. After the overhead junction box has been secured in position on the cross-brace, the electrical connection from the wall switch is run to the overhead junction box.

While holding the overhead light adjacent to the overhead junction box, the electrical connection inside of the junction box must be connected to the overhead light. After the electrical connection has been completed to the overhead light, then the overhead light must be secured to the overhead junction box. This process normally takes two people, one person holding the overhead light while the other person makes the electrical connection. Thereafter, one person holds the overhead light while the other person secures the overhead lamp to the overhead junction box. After the overhead lamp has been secured to the overhead junction box, a decorative cover is secured in position above the overhead light to cover the overhead junction box.

Because this type of installation is normally done by a licensed electrician, most people do not change their overhead lights, at least not very often. Typically the same overhead light will be used for decades. Normally, the overhead light is only changed when there is an electrical problem or the room is being totally redecorated.

BRIEF SUMMARY OF THE INVENTION

It is an object of the present invention to provide a plug-in type connection for an overhead light.

It is another object of the present invention to provide a plug-in type connection for an overhead light with some additional structural support for the overhead light.

It is yet another object of the present invention to be able to change overhead lights without the assistance of an electrician.

Electrical wires are run from the wall switch to an overhead junction box to provide electrical connections there between. The electrical wires extend through an opening in the side of the overhead junction box, which overhead junction box is securely fastened to a cross-brace. The electrical wires are connected to a female-type, twist lock, electrical plug. The female-type, twist lock, electrical plug is mounted in a cover plate. Once the electrical wires are connected to the female-type, twist lock, electrical plug, the cover plate to which the electrical plug is mounted is then secured to the open, bottom side of the overhead junction box.

To connect an overhead light to the female-type, twist lock, electrical plug, all that would be necessary would be to have an overhead light that has a male-type, twist lock, electrical plug on one end thereof. By screwing a light bulb into a light socket and plugging the male-type twist lock electrical plug into the female-type, twist lock, electrical plug, an overhead light is created.

To keep from the overhead light being a bare light bulb, a decorative cover is secured to the male-type, twist lock, electrical plug. The decorative cover is designed to overlap and hide the cover plate. A light globe may also extend out from the decorative cover to enclose the light bulb. The attachment of the light globe to the decorative cover can be of any conventional means, such as a lip with a clamp there around, or any other conventional means.

To give additional strength so that the overhead light is not hanging entirely by the twist lock, electrical plug, the cover plate and overhead junction box may have mounting screws threaded thereto with a retaining nut holding the mounting screws in position. The mounting screws would extend down from the cover plate into a slotted connection of the decorative cover. The slotted connections are located so that when the male-type, twist lock, electrical plug is inserted into the female-type, twist lock, electrical plug, the heads of the mounting screws extend through an enlarged portion of the slotted connections. Thereafter, when the male-type, twist lock, electrical plug is twisted to securely seat the plug, the heads of the mounting screws move into the smaller portion of the slotted connections to help hold the weight of the overhead light.

DESCRIPTION OF THE PREFERRED EMBODIMENT

Figure 1:
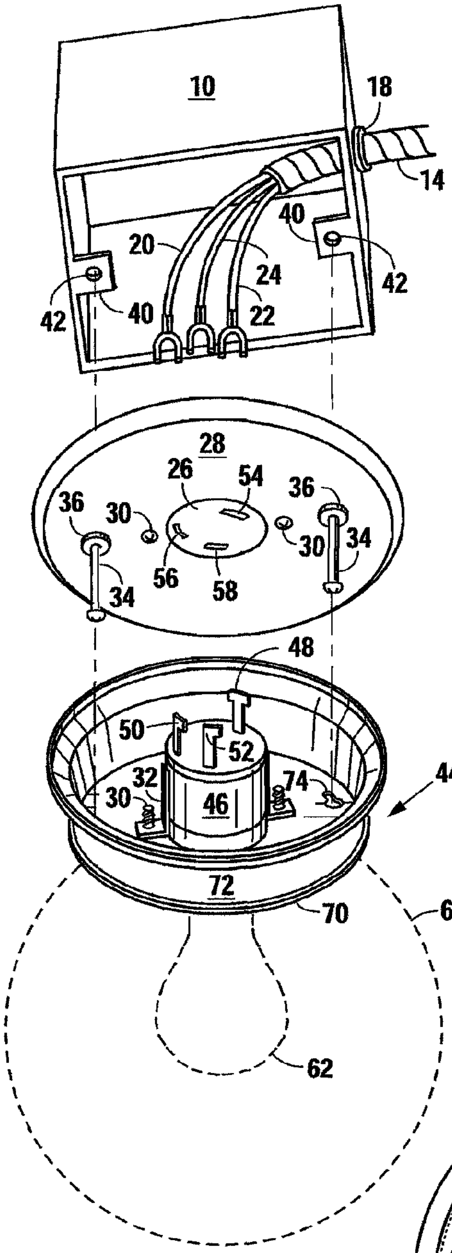
FIG. 1 is an exploded perspective view of a plug-in, overhead light.
Figure 2:
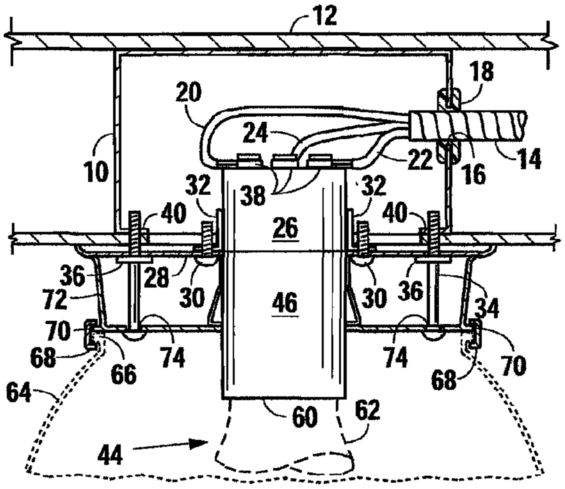
FIG. 2 is a partial sectional view of a plug-in, overhead light when installed.

Referring now to FIGS. 1 and 2 in combination, a junction box 10 is mounted in the ceiling of a building, typically to a cross-brace 12 connected between ceiling joists (not shown). An electrical cable 14 extends into the junction box 10 through a cable opening 16. To protect the electrical cable 14, a rubber grommet 18 surrounds the cable opening 16. The opposite end of the electrical cable 14 extends to a light switch (not shown).

From the end of the electrical cable 14 extends black wire 20, white wire 22 and green wire 24. The green wire 24 is a ground and the black wire 20 and the white wire 22 are both hot. The black wire 20, white wire 22 and green wire 24 connect to the screw terminals 38 on the backside of a female-type, twist lock, electrical plug 26. The female-type, twist lock, electrical plug 26 is secured in a junction box plate 28 by screws 30 connecting through shoulder brackets 32.

Secured within junction box plate 28 are locking posts 34 that are spaced a distance from the junction box plate 28 by threaded nuts 36. After the wires 20, 22 and 24 are connected to the screw terminals 38 of the female-type, twist lock, electrical plug 26, it is time to mount the junction box plate 28 on the junction box 10. Tabs 40 of junction box 10 have screw holes 42 therein for receiving a threaded connection with locking post 34. When the junction box plate 28 is securely connected to the junction box 10, locking post 34 will extend there from a determined distance as set by threaded nuts 36.

A removable overhead light 44 is shown that includes a male-type, twist lock, electrical plug 46. The male-type, twist lock, electrical plug 46 has on a first end thereof a ground T connection 48 for mating with the green wire 24 of the female-type, twist lock, electrical plug 26. Hot locking connections 50 and 52 are provided to connect with black wire 20 and white wire 22 in the female-type, twist lock, electrical plug 26. The slotted openings 54, 56 and 58 are just large enough to receive there through ground T connection 48, hot locking connection 50 and hot locking connection 52 so that when the male-type, twist lock, electrical plug 58 is turned, it is securely locked in position with good electrical connections there through.

On the opposite end of the male-type, twist lock, electrical plug 46 from connections 40, 50 and 52 is a light bulb type socket 60. The light bulb type socket 60 may hold a light bulb 62 or any other type of luminary device that has a base that matches the light bulb type socket 60. Around the light bulb 62 is a globe 64. The globe 64 may be of any particular design or style. To hold the globe 64 into position, an upper lip 66 is held by a C-clamp 68. The C-clamp 68 holds the upper lip 66 of globe 64 to a lower flange 70 of the decorative cover 72.

The decorative cover 72 has slotted opening 74 therein to receive the heads of locking post 34. At the same time, the male-type, twist lock, electrical plug 46 is inserted in a female-type, twist lock, electrical plug 26. Thereafter, when the removable overhead light 44 is twisted to ensure a locking connection, not only does the male-type, twist lock, electrical plug 46 lock with the female-type, twist lock, electrical plug 26, but locking post 34 is secured in the narrow portion of the slotted opening 74. This insures the locking post 34 will help support the weight of the removable overhead light 44.

Figure 3:
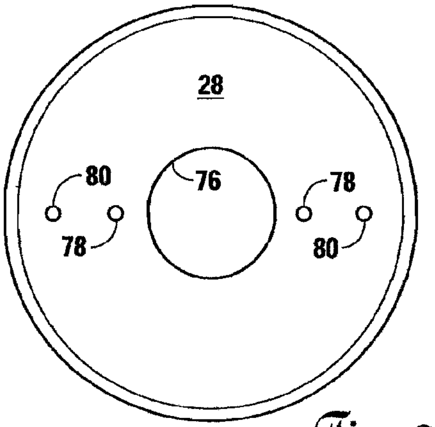
FIG. 3 is a bottom view of the cover plate.

Referring now to FIG. 3, a plan view of the junction box plate 28 is shown. Center opening 76 receives the female-type, twist lock, electrical plug 26 therein. Screw holes 78 allow the screws 30 to extend there through to connect to the shoulder brackets 34 of the female-type, twist lock, electrical plug 26. Mounting holes 80 allow the locking posts 34 to extend there through when connecting into screw holes 42 in the tabs 40 of the junction box 10 (see FIGS. 1 and 2).

Figure 4:
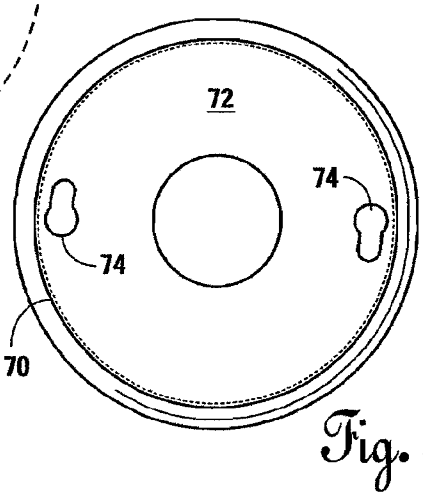
FIG. 4 is a bottom view of the decorative cover.

Referring now to FIG. 4, a plan view of the decorative cover 72 is provided. The outside circumference of the decorative cover is large enough to fit over the junction box plate 28. The decorative cover 72 has the slotted openings 74 therein to receive the locking post 34. The lowermost portion of the decorative cover 74 has a lower flange 70 for engaging with C-clamp 68 to hold the globe 64 in position.

Figure 5:
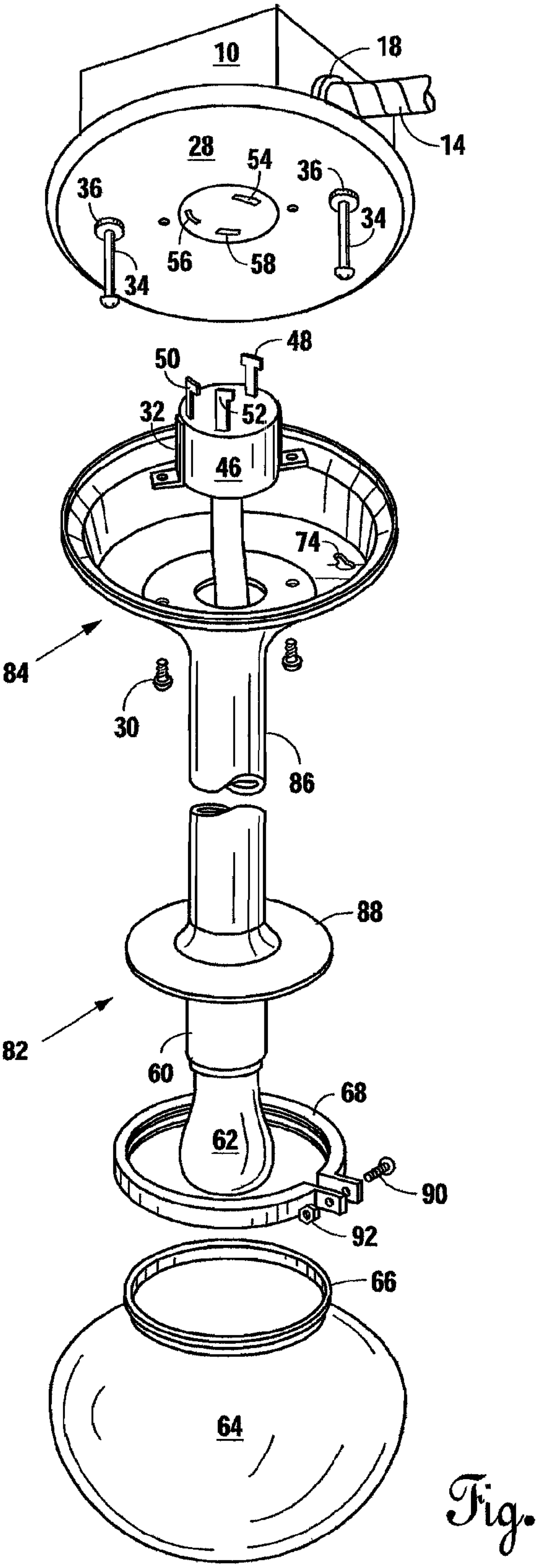
FIG. 5 is an exploded perspective view of a plug-in overhead light that extends downward from the ceiling.

Referring now to FIG. 5, a lower extending overhead light 82 is shown. The injunction box and the items connected to the junction box are the same as described previously in connection with FIGS. 1 and 2 and will have the same numerals. The light bulb 62, globe 64 and C-clamp 68 are the same as what has previously been described. The part that is different is the decorative cover 72 in FIGS. 1 and 2 has been replaced with an extended decorative cover 84. The extended decorative cover 84 has slotted openings 74 for receiving locking posts 34 therein, the same as FIGS. 1 and 2. However, extended decorative cover 84 has a downward extension 86 that has on the upper end thereof a male-type twist lock electrical plug 46, the same as FIGS. 1 and 2. At the lower end of the male-type twist lock electrical plug 46 is an outward flange 88 of the downward extension 86 of the extended decorative cover 84. The downward extension 86 may be of any particular desired length.

The globe 64 is connected to the outward flange 88 by the C-clamp 68 clamping over upper lip 66 and outward flange 88 and being secured by screw 90 and nut 92.

It is envisioned that the lower extending, removable overhead lamp 82 may be connected in the same way as the removable overhead lamp 44 as shown in FIGS. 1 and 2. Also, while one method of connecting the globes 64 is shown, many other methods of connecting the globe, including threaded connections can be utilized. The objective is to have a pluggable overhead light that can easily be plugged and unplugged, but still have some type of structural support.

What I claim is:

1. A method of providing a removable overhead light in a ceiling that can be connected to a source of electrical power and removed without a licensed electrician, including the following steps:

mounting an electrical junction box in said ceiling, said electrical junction box having an electrical junction box plate;

running said source of electrical power to said electrical junction box;

electrically connecting said source of electrical power to a female type, twist lock, electrical plug;

securing said female type, twist lock, electrical plug in said junction box;

plugging an overhead light in said female type, twist lock, electrical plug, said overhead light including:

attaching a male type, twist lock, electrical plug to a decorative cover plate for covering said electrical junction box;

providing a light socket on an end opposite from said male type, twist lock, electrical plug;

inserting a luminary device such as a light bulb in said light socket;

installing a globe over said luminary device, said globe being connected to said decorative cover plate;

simultaneously rotating and mating said male type, twist lock, electrical plug and said decorative cover plate such that said male type, twist lock, electrical plug and said decorative cover plate twist lock with said female, twist lock, electrical plug and said electrical junction box plate, respectively; and applying power to illuminate said luminary device.

* * * * *